(12) United States Patent
Yang

(10) Patent No.: US 8,232,633 B2
(45) Date of Patent: Jul. 31, 2012

(54) IMAGE SENSOR PACKAGE WITH DUAL SUBSTRATES AND THE METHOD OF THE SAME

(75) Inventor: Wen-Kun Yang, Hsin-Chu (TW)

(73) Assignee: King Dragon International Inc., Road Town, Tortola (VG)

( * ) Notice: Subject to any disclaimer, the term of this patent is extended or adjusted under 35 U.S.C. 154(b) by 0 days.

(21) Appl. No.: 13/289,864

(22) Filed: Nov. 4, 2011

(65) Prior Publication Data

US 2012/0043635 A1 Feb. 23, 2012

Related U.S. Application Data

(63) Continuation-in-part of application No. 12/232,847, filed on Sep. 25, 2008.

(51) Int. Cl.
*H01L 23/48* (2006.01)
(52) U.S. Cl. ........ 257/692; 257/684; 257/685; 257/700; 257/774
(58) Field of Classification Search .................. 257/684, 257/685, 686, 692, 700, 774, E23.06, E23.001, 257/E23.141, E23.142, E23.145, E23.169, 257/E21.505
See application file for complete search history.

(56) References Cited

U.S. PATENT DOCUMENTS

| | | | |
|---|---|---|---|
| 7,501,501 B2 * | 3/2009 | Topalian et al. | 536/23.1 |
| 2008/0020511 A1 * | 1/2008 | Yang et al. | 438/110 |
| 2008/0108168 A1 * | 5/2008 | Yang et al. | 438/64 |
| 2008/0136004 A1 * | 6/2008 | Yang et al. | 257/686 |
| 2008/0217761 A1 * | 9/2008 | Yang et al. | 257/700 |
| 2009/0096098 A1 * | 4/2009 | Yang et al. | 257/738 |
| 2009/0127686 A1 * | 5/2009 | Yang et al. | 257/686 |
| 2009/0166873 A1 * | 7/2009 | Yang et al. | 257/758 |

* cited by examiner

*Primary Examiner* — N Drew Richards
*Assistant Examiner* — Joannie A Garcia
(74) *Attorney, Agent, or Firm* — Shimokaji & Associates, P.C.

(57) ABSTRACT

The image sensor package with dual substrates comprises a first substrate with a die receiving opening and a plurality of first through hole penetrated through the first substrate; a second substrate with a die opening window and a plurality of second through hole penetrated through the second substrate, formed on the first substrate. A part of the second wiring pattern is coupled to a part of the third wiring pattern; an image die having conductive pads and sensing array received within the die receiving opening and the sensing array being exposed by the die opening window; and a through hole conductive material refiled into the plurality of second through hole, some of the plurality of second through hole coupling to the conductive pads of the image sensor.

15 Claims, 7 Drawing Sheets

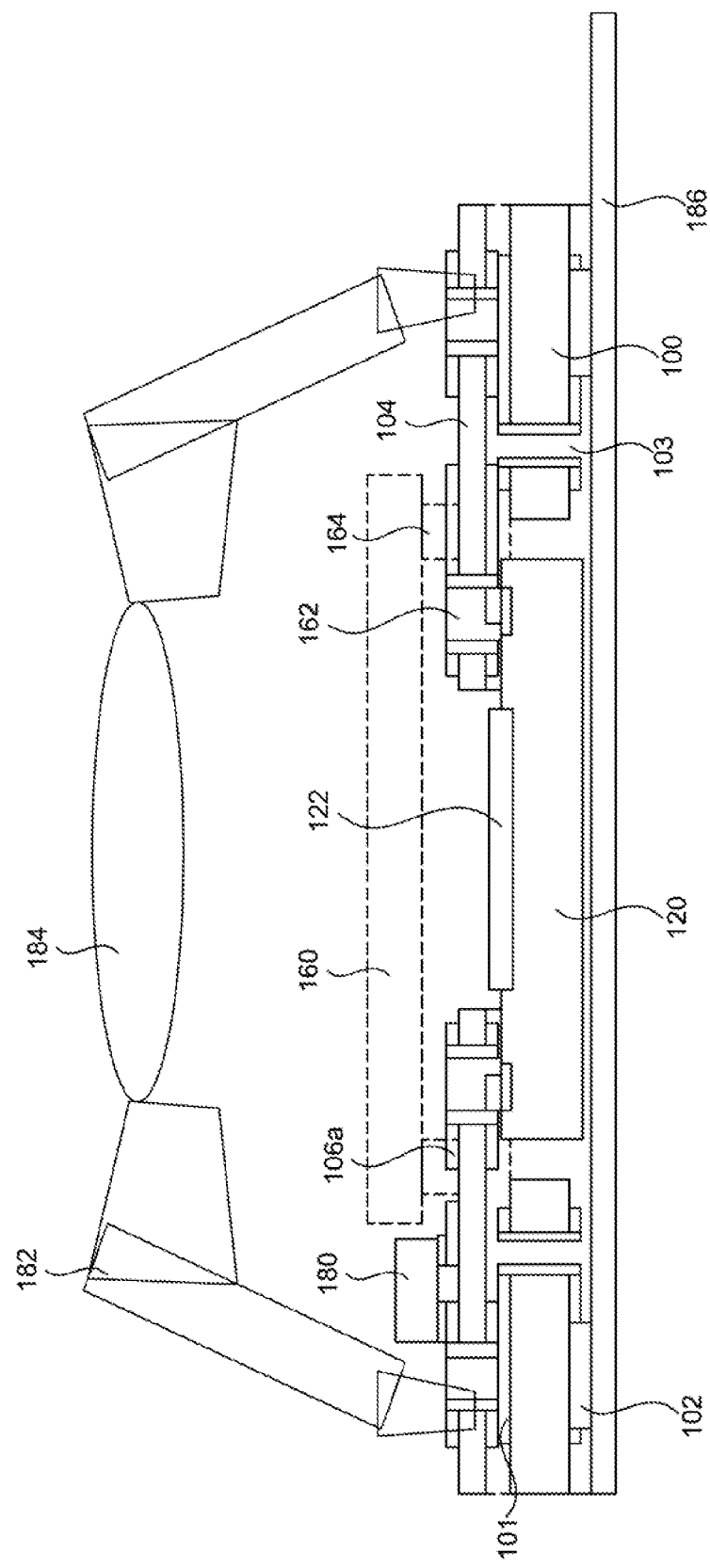

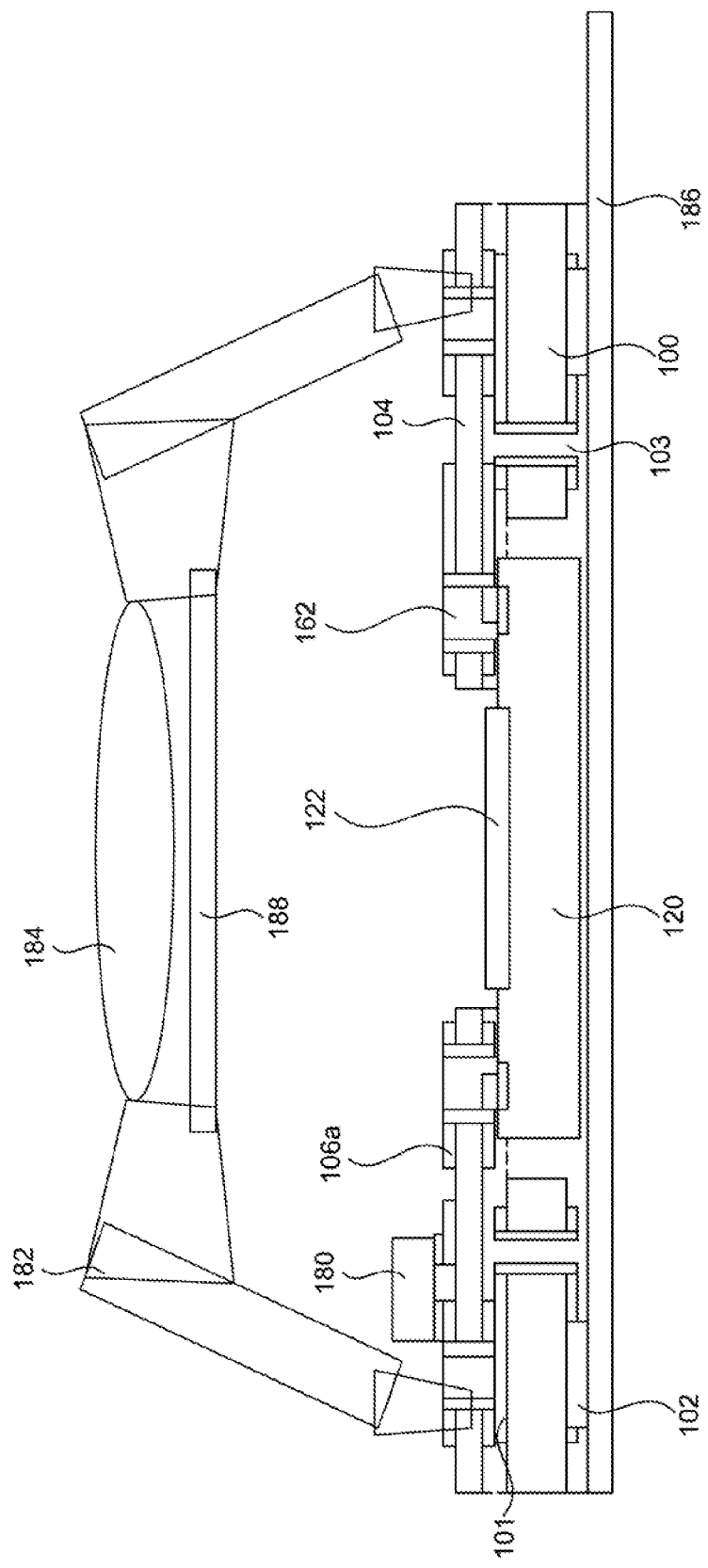

ics vertical# IMAGE SENSOR PACKAGE WITH DUAL SUBSTRATES AND THE METHOD OF THE SAME The invention is relative to Continuation-In-Part (CIP) of application Ser. No. 12/232,847 that filing on date Sep. 25, 2008 by the inventor.

FIELD OF THE INVENTION

This invention relates to an image sensor package, and more particularly to an image sensor package with dual substrates having die embedded therein.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support, and so on. As a semiconductor become more complicated, the traditional package technique, for example lead frame package, flex package, rigid package technique, can't meet the demand of producing smaller chip with high density elements on the chip. The trend of package technique is toward ball grid array (BGA), flip chip (FC-BGA), chip scale package (CSP), Wafer level package (WLP) today.

Image sensors have become widely used in digital still cameras, cellular phones, automobile, and other applications. The technology used to manufacture image sensors, and in particular CMOS image sensors, has continued to advance at great pace. For example, the demands of higher resolution and lower power consumption have encouraged the further miniaturization and integration of the image sensor. In a large number of image sensors, a photodiode structure called a pinned or a buried photodiode is used because of its low noise performance. In this photodiode structure, a P+ layer is implanted at or below the surface of the photodiode adjacent to a transfer gate. An N− layer is implanted deeper into the silicon substrate. This is the buried layer that stores charge away from the surface region, and thus, away from defects at the surface of the silicon substrate. The purpose of the P+ layer is to provide a photodiode with increased storage capacitance and to passivate the defects on the photodiode surface.

Various structures using flip-chip mounting of an image sensor chip have been developed in an attempt to simplify the construction of image sensor packages. U.S. Pat. No. 6,144,507 discloses an image sensor chip mounted directly to a printed circuit board (PCB). An image sensor chip is mounted in flip-chip fashion over an aperture within the PCB, and a transparent cover is either attached directly to the active surface of the chip or bonded to the side of the PCB opposite that to which the image sensor chip is attached and over the aperture. Although these methods eliminate the difficulties associated with wire bonding, however, the PCB's is very large with respect to the size of the image sensor chip and the transparent cover.

U.S. Pat. No. 5,786,589 bonding a TAB sheet to a glass substrate and bonding an image sensor chip to the TAB tape with an conductive film. This design requires a specialized substrate attachment technique due to the TAB-type connection leads. Moreover, the conductive film risks interference with sensing circuitry on the image sensor chip and requires the formation of dummy leads or dam structures to compensate for this problem.

U.S. Pat. No. 6,885,107 disclosed conventional type image sensor package. It employed a BGA package which includes a plurality of ball under the substrate and the die is exposed outside of the substrate. In accordance with the present invention, image sensor packaging having the above-described and other beneficial characteristics and methods for fabrication thereof are provided. An image sensor chip is flip-chip mounted to conductive traces on a first surface of a transparent substrate. The active surface of the image sensor chip is protected from contamination after mounting by depositing a bead of sealant around the periphery of the image sensor chip between the active surface of the image sensor chip and the first surface of the substrate, thus eliminating any need for additional damming structures or spacing frames as used in the prior art. Discrete conductive elements such solder balls or columns are attached to ends of the conductive traces which form an array pattern, the discrete conductive elements extending transversely from the conductive traces on the first surface to a substantially common plane at a level beyond a back surface of the image sensor chip. The resulting structure comprises a board-over-chip (BOC) package arrangement. Thus, the thickness of the substrate is unlikely to be scaled down due to the structure has ball high and extruding die receiving structure which limits the scale of the package shrinkage.

The prior art suffers complicated processes to form the image package and the package structure is too high and unable to be scaled down. Further, these prior art only disclosed single chip package, no multiple chip structure is illustrated.

SUMMARY OF THE INVENTION

For the aforementioned, the present invention provides an image sensor package with dual substrate.

The object of the present invention is to provide an image sensor package with dual substrate having pre-formed through holes and die receiving opening.

The further object of the present invention is to provide an image sensor package with dual substrate having die opening window to improve the reliability and shrinking the device size.

The further object of the present invention is to provide an image sensor package with dual substrates which have lower and upper wiring patterns by copper clad laminated (CCL) and E-plating Cu/Au or Cu/Ni/Au metal for increasing electrical conductivity.

The image sensor package with dual substrates comprises a first substrate with a die receiving opening and a plurality of first through hole penetrated through the first substrate; a second substrate with a die opening window and a plurality of second through hole penetrated through the second substrate, formed on the first substrate, wherein the first substrate has a first and a second wiring patterns formed on lower and upper surface of the first substrate, the second substrate having a third and a forth wiring patterns formed on lower and upper surface of the second substrate; wherein a part of the second wiring pattern is coupled to a part of the third wiring pattern; an image die having conductive pads and sensing array received within the die receiving opening and the sensing array being exposed by the die opening window; and a through hole conductive material refilled into the plurality of second through hole, some of the plurality of second through hole coupling to the conductive pads of the image sensor.

A glass is formed on the second substrate and over the die opening window. A lens holder having lens is then formed over the glass, wherein the lens is aligned with the image sensor. An IR filter formed within the lens holder. A passive device and/or active die formed on the second substrate, wherein the active die includes CSP, WL-CSP, BGA, flip chip. Alternatively, at least sidewall of the plurality of first through holes includes conductive metal. The through holes conductive material includes metal or alloy such as solder or ACF (Anisotropic Conductive Film). The material of the first and second substrate includes FR5 or FR4. Optionally, the first and second substrate includes BT, silicon, PCB (print circuit board) material, glass, ceramic, metal or alloy metal.

BRIEF DESCRIPTION OF THE DRAWINGS

FIG. 6 illustrates a cross sectional view of forming the lens holder over the second substrate according to the present invention.

FIG. 7 illustrates a cross sectional view of further embodiment according to the present invention.

DESCRIPTION OF THE PREFERRED EMBODIMENT

Figure 1:
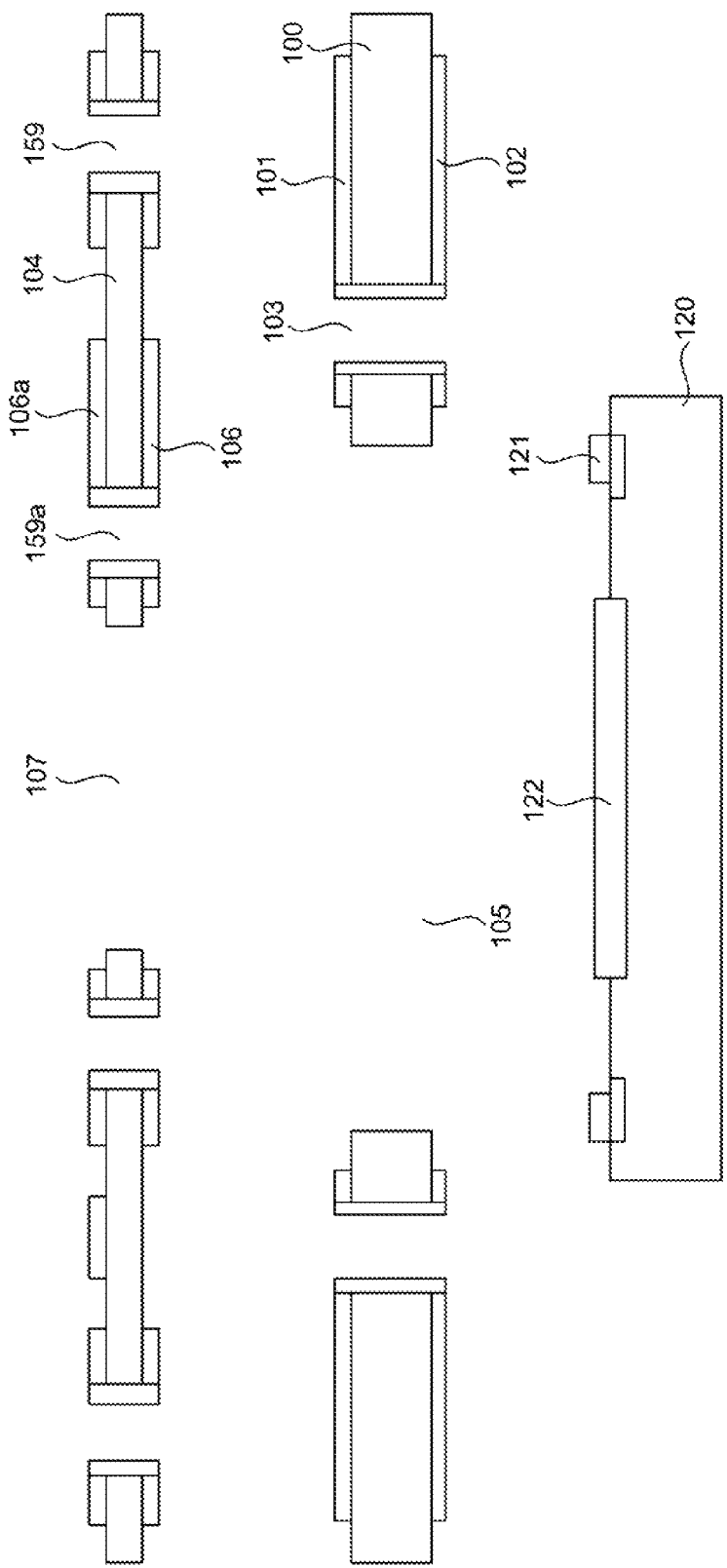
FIG. 1 illustrates a cross-sectional view of a first, a second substrate and image sensor before connection according to the present invention.

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

The present invention discloses a substrate structure with die (or multi-chips) embedded and dual build-up layers formed over the both side-surfaces, shown in FIGS. 6 and 7, and it illustrates a cross sectional view of system in package (SIP) structure which includes a substrate having die embedded inside with dual layers and passive components, WL-CSP, CSP, BGA, Flip Chip etc. surface mounting on top build up layers and terminal pins on opposite side according to the present invention.

The image sensor package includes a first substrate 100 includes a wiring pattern 101 on top surface and a wiring pattern 102 on bottom surface of the first substrate 100. A connecting conductive through holes 103 may be formed for penetrating through the first substrate 100 connected to the wiring pattern 101, 102 for connection. The first substrate 100 has a die receiving opening 105 for receiving a die/chip 120 which has sensing array 122 formed thereon. The die (image sensor) 120 has conductive (such as Al or Au) pads 121 (I/O pads) formed thereon. The die 120 is disposed within the die receiving opening 105 of the first substrate 100. A second substrate 104 is formed on the first substrate 100, with die opening window 107 and a wiring pattern 106a on top surface and a wiring pattern 106 on bottom surface of the second substrate 104. The wiring pattern 106 is connected to the wiring pattern 101. A conductive through holes 159 are formed by passing through the second substrate 100 and are connected to the wiring pattern 101. A further conductive through holes 159a are formed by passing through the second substrate 100 and are connected to the conductive (such as Al or Au) pads 121 of the image sensor 120.

The conductive through holes 159, 159a may be filled with conductive material, such as metal, alloy. In one case, they are formed with solder or ACF. In one embodiment, the conductive through holes 159a are connected to the die conductive pads 121. An optical glass 160 is attached over the second substrate 104 by adhesive material 162. The optical glass exposes the sensing array 122 of the sensor 120. At least one active or passive component 180 is soldering mounting on top wiring 106a of the second substrate 104. The aforementioned structure (SIP) constructs a LGA type package which omits solder balls to scale down the thickness of the package.

Preferably, the material of the first and second substrate 100 and 104 is organic substrate likes epoxy type FR5, BT, PCB. Preferably, CTE of the first and second substrate 100 and 104 is substantially the same as the one of the mother board (PCB). Preferably, the organic substrate with high Glass transition temperature (Tg) are epoxy type FR5 or BT (Bismaleimide triazine) type substrate, the above materials can be easy to form the circuit pattern and inter-connecting through holes. The Cu metal (CTE around 16) can be used also. The glass, ceramic, silicon can be used as the substrate. The adhesion material is preferably to form of silicone rubber based elastic materials. It is because that the CTE (X/Y direction) of the epoxy type organic substrate (FR5/BT) is around 14-17 and the CTE in Z direction is about 30-60, it can reduce the die shift issue during the temperature curing of the adhesion material. In one embodiment of the invention, the material of the wiring layers 102, 101, 106, 106a include Cu/Ni/Au alloy or Cu/Au alloy; the thickness of the wiring layers is from 5 um and 25 um (it also can be thicker than 25 um if necessary). The CCL (copper clad laminated) is formed by lamination also as seed metal layers, and the Cu/Au or Cu/Ni/Au alloy is formed by electroplating; exploiting the electroplating process to form the wiring layers with enough thickness and better mechanical properties to withstand CTE mismatching during temperature cycling and mechanical bending. The conductive pads can be Au or Cu/Au or Al or combination thereof.

In one embodiment of the invention, a first substrate 100 has the conductive wiring pattern 101 formed on the top surface and a wiring patterned 102 on the bottom surface of the first substrate 100, as shown in FIG. 1, the wiring pattern 101,102 includes CCL Cu and E-plating Cu/Ni/Au. The die 120 has conductive (Al or Au) pads 121 (I/O pads) formed therein. The die 120 is disposed within the die receiving opening 105 of the first substrate 100. A second substrate 104 is formed on the first substrate 100, with die opening window 107 and a wiring pattern 106a on top surface and a wiring pattern 106 on bottom surface of the second substrate 104.

Figure 2:
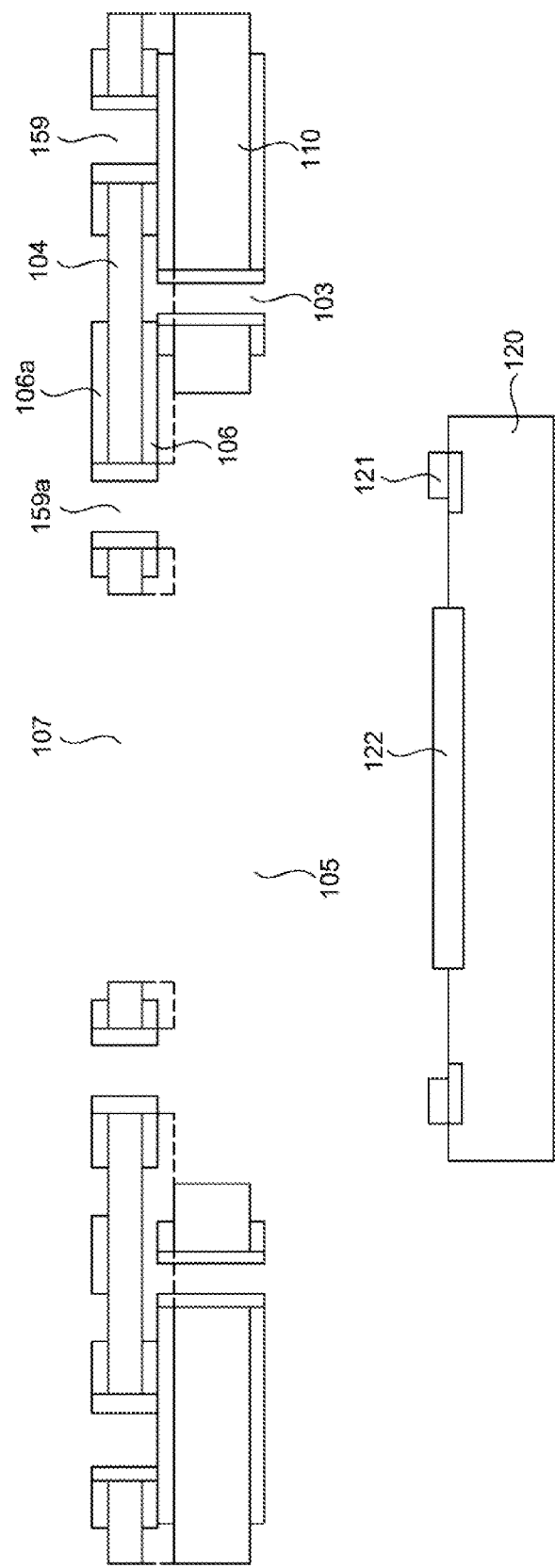
FIG. 2 illustrates a cross-sectional view of the combination of the first and the second substrate with die opening window according to the present invention.

The processes of forming the image package of the present invention includes preparing a first substrate 100 and a second substrate 104 (preferably organic substrate FR4/FR5/BT raw material) and the first substrate has wiring circuit 102, 101 formed on top and bottom surface of the first substrate 100 respectively. The wiring pattern 106a, 106 are formed on top and bottom surface of the second substrate 104 respectively, shown in FIG. 1. The layers 101, 102, 106a and 106 of the substrates may be formed by E-plating with Cu/Ni/Au. The connecting conductive through holes 103 may be formed by passing through the first substrate 100. The first substrate 100 has pre-formed die receiving opening 105 and the die opening window 107 is also pre-formed, the die receiving opening 105 with the size larger than die size plus around 100 um-200 um per side by laser cutting or mechanical punching (multiple dice puncher), shown in FIGS. 1 and 2. The second substrate 104 is attached (adhesion film) on the first substrate 100 as shown in FIG. 2.

Figure 3:
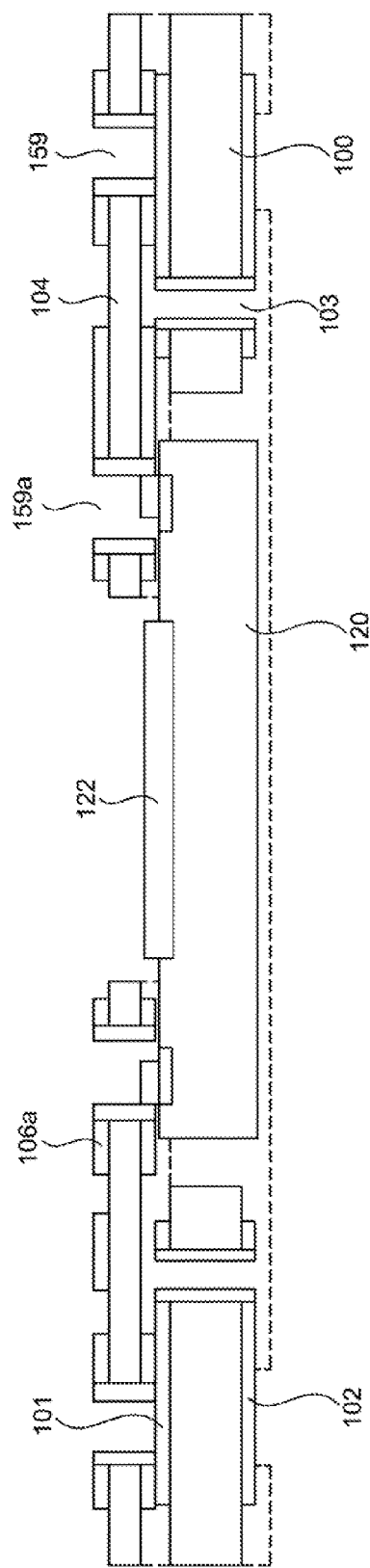
FIG. 3 illustrates a cross-sectional view of receiving the die into the first substrate according to the present invention.
Figure 4:
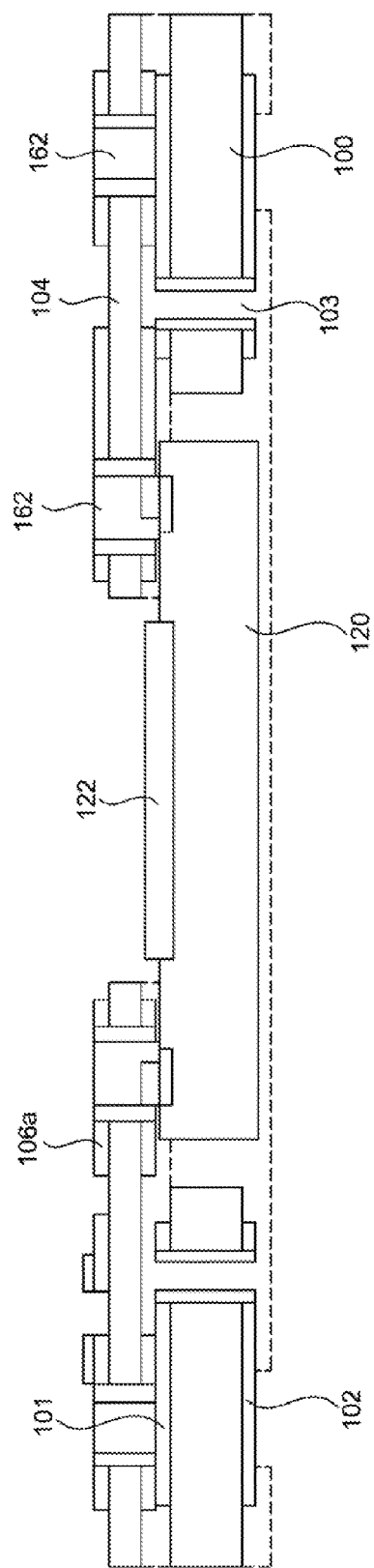
FIG. 4 illustrates a cross sectional view of forming the solder into the through holes according to the present invention.

The next step is to set the image sensor 120 into the die receiving opening 105 and the sensor area 122 is exposed by the die opening window 107 of the second substrate 104 by die/substrate placement and alignment tool as shown in FIG. 3. The next step is to form the conductive material 162 such as solder into the through holes 159, 159a of the second substrate 104. The filling step maybe formed before attaching the second substrate 104 on the first substrate 100. The IR reflow process is performed after the solder is refilled to flow the solder into the through-holes and contacts to the pads 121 within the through holes 159a.

Figure 5:
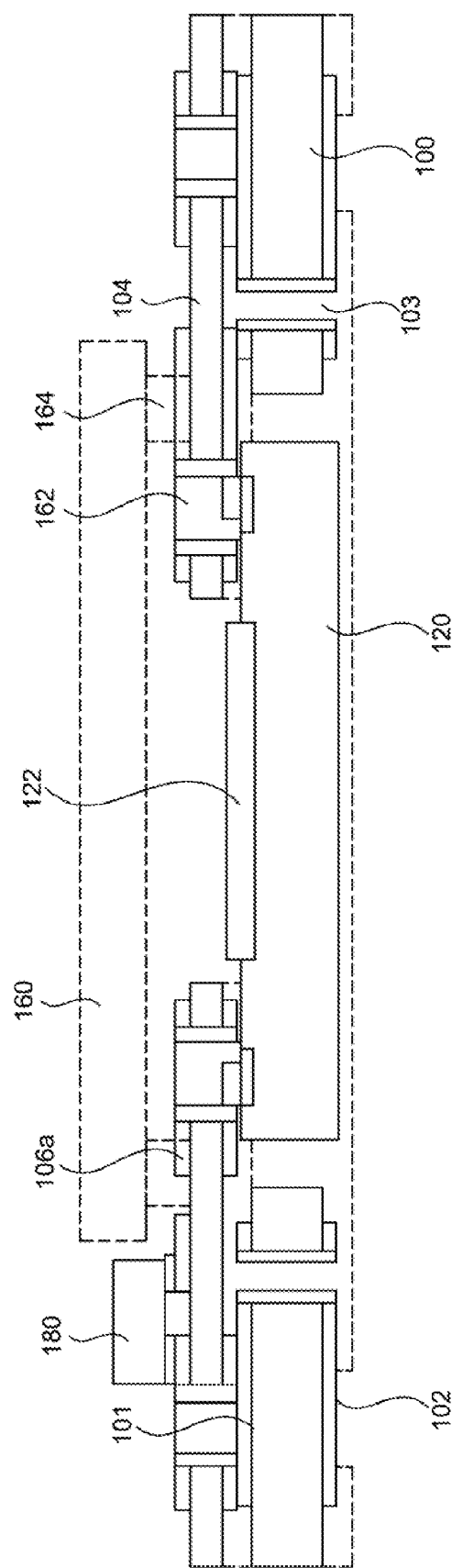
FIG. 5 illustrates a cross sectional view of attaching glass on the second substrate according to the present invention.

Once the solder 162 is refilled into the through holes 159, 159a, the glass 160 is subsequently formed on the second substrate 104 by adhesive material 164 as optional process. The active or passive device 180 is also attached (SMT) at the stage as shown in FIG. 5. Then, the lens holder 182 has optical lens 184 is attached on the second substrate 104 and aligned with the image sensor 120 as shown in FIG. 6. The first substrate 100 may be attached on a FPC 186 by solder or ACF. The high of the optical lens is determined by the optical performance and physical parameters. An optional IR filter 188 may be formed within the lens holder 184 as shown in FIG. 7 (IR filter 188 can replaces the glass 160).

The passive component 180 could be such as capacitor or resistor. A further die formed by WL-CSP, CSP, BGA, Flip Chips, can also be mounted on top circuit of the second substrate 104. It, therefore, constructs at least two chips embedded inside together and has conductive through holes for inter-connecting the electrical signals. All of the conductive through holes 159, 159a, 103 may be formed by CNC or laser drilling.

The SIP structure and process are simple than conventional image package which fails to disclose the multi-chip and dual substrates structure. The thickness of the image package is easy to be controlled and die shift issue will be eliminated during process. The injection mold tool is omitted, CMP polish process will not be introduced either, and no warp result from the process. The substrate is pre-prepared with pre-formed die opening window, inter-connecting through holes; the size of die receiving opening window is equal to die size plus around >100 um-200 um per side; it can be used as stress buffer releasing area by filling the adhesive elastic core paste materials to absorb the thermal stress due to the CTE between silicon die and substrate (FR5/BT) is difference, additionally, it can fill the elastic dielectric materials to the gap between die edge and side wall of the substrate to absorb the mechanical bending and/or thermal stress due to the CTE mismatch. The packaging throughput will be increased (manufacturing cycle time was reduced) due to apply the simple build up layers on top the surface and bottom site of the substrates at the same time. The die and substrates (both second and first substrates) be bonded together. The reliability for both package and board level is better than ever, especially, for the board level temperature cycling test, it was due to the CTE of substrate and PCB mother board are identical, hence, no thermal mechanical stress be applied on the solder bumps/balls; for the board level mechanical bending test, it was due to bottom side of substrate to support the mechanical strength allowing absorb the stress generated at top side die area and boundary area.

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. An image sensor package with dual substrates comprising:
   a first substrate with a die receiving opening and a plurality of first through hole penetrated through said first substrate;
   a second substrate with a die opening window and a plurality of second through hole penetrated through said second substrate, formed on said first substrate, wherein said first substrate has a first and a second wiring patterns formed on lower and upper surface of said first substrate, said second substrate having a third and a forth wiring patterns formed on lower and upper surface of said second substrate; wherein a part of said second wiring pattern is coupled to a part of said third wiring pattern;
   an image sensor die having conductive pads and sensing array received within said die receiving opening and said sensing array being exposed by said die opening window; and
   a through hole conductive material refilled into said plurality of second through hole, some of said plurality of second through hole coupling to said conductive pads of said image sensor.

2. The package of claim 1, further comprising a glass formed on said second substrate and over said die opening window.

3. The package of claim 2, further comprising a lens holder having lens formed over said glass, wherein said lens is aligned with said image sensor.

4. The package of claim 3, further comprising a IR filter formed within said lens holder.

5. The package of claim 1, further comprising a lens holder having lens formed over said second substrate, wherein said lens is aligned with said image sensor.

6. The package of claim 5, further comprising a IR filter formed within said lens holder.

7. The package of claim 1, further comprising a passive die formed on said second substrate.

8. The package of claim 7, further comprising an active die formed on said second substrate.

9. The package of claim 8, wherein said active die includes CSP, WL-CSP, BGA, flip chip.

10. The package of claim 1, wherein a at least sidewall of said plurality of first through holes includes conductive metal.

11. The package of claim 1, wherein said through hole conductive material includes metal or alloy or ACF.

12. The package of claim 11, wherein said through hole conductive material includes solder.

13. The package of claim 1, wherein material of said first and second substrate includes FR5 or FR4.

14. The package of claim 1, wherein material of said first and second substrate includes BT, silicon, PCB (print circuit board) material, glass, ceramic, metal or alloy metal.

15. The package of claim 1, where said first, second, third and forth wiring pattern includes Cu or Cu/Ni/Au metal, which formed by CCL and/or E-plating.

\* \* \* \* \*